United States Patent
Kakimoto et al.

(10) Patent No.: US 7,615,251 B2
(45) Date of Patent: Nov. 10, 2009

(54) PROCESSING DEVICE USING SHOWER HEAD STRUCTURE AND PROCESSING METHOD

(75) Inventors: Akinobu Kakimoto, Yamanashi (JP); Kentaro Oshimo, Yamanashi (JP); Masahiko Matsudo, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 819 days.

(21) Appl. No.: 10/511,440

(22) PCT Filed: Apr. 22, 2003

(86) PCT No.: PCT/JP03/05123

§ 371 (c)(1),
(2), (4) Date: Oct. 25, 2004

(87) PCT Pub. No.: WO03/092060

PCT Pub. Date: Nov. 6, 2003

(65) Prior Publication Data

US 2005/0223981 A1 Oct. 13, 2005

(30) Foreign Application Priority Data

Apr. 24, 2002 (JP) ............................. 2002-123145
Feb. 5, 2003 (JP) ............................. 2003-028876

(51) Int. Cl.
*C23C 16/00* (2006.01)
*C23C 16/06* (2006.01)

(52) U.S. Cl. ............................. 427/255.4; 427/255.32; 427/255.28; 427/255.23; 427/248.1

(58) Field of Classification Search ........................ None
See application file for complete search history.

(56) References Cited

U.S. PATENT DOCUMENTS

| 6,113,700 | A | 9/2000 | Choi |
| 6,126,753 | A | 10/2000 | Shinriki et al. |
| 6,228,173 | B1 | 5/2001 | Okase et al. |
| 2002/0034857 | A1* | 3/2002 | Park et al. .................... 438/396 |

FOREIGN PATENT DOCUMENTS

JP 9-017778 1/1997
JP 2001-185544 7/2001

* cited by examiner

*Primary Examiner*—Timothy Meeks
*Assistant Examiner*—Kelly M Gambetta
(74) *Attorney, Agent, or Firm*—Oblon, Spivak, McClelland, Maier & Neustadt, L.L.P.

(57) ABSTRACT

A processing device, comprising a processing container, a shower head structure provided at the ceiling part of the processing container and having a plurality of gas jetting holes for jetting specified processing gas into the processing container formed in the gas jetting surface thereof facing the inside of the processing container, and a placing stand disposed in the processing container so as to face the shower head structure, wherein a head distance between the gas jetting surface and the placing stand and the blowing speed of gas from the gas jetting holes are set within the range surrounded by connecting, in a square shape with straight lines in a plane coordinate system having the head distance plotted on an abscissa and the gas jetting speed plotted on a coordinate, a point where the blowing speed of the gas from the gas jetting holes at the head distance of 15 mm is 32 m/sec, a point where the blowing speed of the gas from the gas jetting holes at the head distance of 15 mm is 67 m/sec, a point where the blowing speed of the gas from the gas jetting holes at the head distance of 77 mm is 40 m/sec, and a point where the blowing speed of the gas from the gas jetting holes at the head distance of 77 mm is 113 m/sec.

13 Claims, 9 Drawing Sheets

FIG.7B (PRESENT INVENTION)

PROCESSING DEVICE USING SHOWER HEAD STRUCTURE AND PROCESSING METHOD

FIELD OF THE INVENTION

The present invention relates to a processing apparatus and a processing method for processing an object to be processed such as a semiconductor wafer.

BACKGROUND OF THE INVENTION

In the course of manufacturing a semiconductor integrated circuit (IC), various single wafer processes such as a film forming process, an etching process, a heat treating process, a reforming process and a crystallization process are repeatedly carried out on an object to be processed, e.g., a semiconductor wafer. While executing such processes, processing gases needed for the corresponding processes, e.g., a film formation gas for the film forming process; ozone gas or the like for the reforming process; $O_2$ gas, an inert gas such as $N_2$ gas, or the like for the crystallization process, are respectively introduced into processing chambers.

For instance, in a single wafer processing apparatus for one by one heat treatment on semiconductor wafers, a mounting table incorporating therein, e.g., a resistance heater is installed in a processing chamber which can be evacuated. A processing gas is then introduced into the processing chamber after mounting a semiconductor wafer on the mounting table to apply various heat treatments on the wafer under given process conditions.

In performing the various heat treatments, it is required to enhance the within wafer uniformity of each heat treatment and improve the throughput thereof in order to maintain high productivity and at the same time to improve electrical characteristics of manufactured products.

In case of, for example, a reforming process for a tantalum oxide ($Ta_2O_5$) film used in a capacitor, ozone is introduced into a processing chamber which can be evacuated and the tantalum oxide film on the surface of the wafer is annealed to be reformed under the presence of $O_3$ (ozone). By such a reforming process, a carbonic component in the tantalum oxide film is removed in the form of $CO_2$. Accordingly, formation of a $SiO_2$ film at an interface between a polysilicon of an underlying layer and the tantalum oxide film is facilitated, thereby improving electrical characteristics. Further, a wafer temperature and an ozone concentration are raised sufficiently enough to improve an efficiency of the reforming process.

As the competition in the manufacturing field of semiconductor ICs becomes ever fiercer recently, continuous improvement of the productivity thereof has become one of the most important keys to remain successful and profitable in the field. In the reforming process described above, however, there is an upper limit in the wafer temperature set due to heat resistance of each layer of the underlying layers formed in preceding processes. The upper limit of the wafer temperature varies depending on a type of a film of the underlying layers and is for example about 720° C. Therefore, the wafer temperature cannot be increased indefinitely in the reforming process for the sake of improving the throughput.

Further, it may be attempted to increase an ozone concentration in order to increase the throughput. Since, however, an ozone concentration is limited by an ozone generator, it is difficult to increase the ozone concentration beyond a current level.

SUMMARY OF THE INVENTION

The present invention is developed to solve such problems as described above. It is, therefore, an object of the present invention to provide a processing apparatus and a processing method capable of improving throughput of heat treatment by maintaining within wafer uniformity of the heat treatment high.

From a study on a reforming process by annealing performed under the presence of ozone, the inventors reached a conclusion that an efficiency of the reforming processing can be increased by setting a gas jetting velocity of a processing gas from a shower head structure into a processing chamber at a high rate within a specific range.

In accordance with the present invention, there is provided a processing device, including: a processing chamber; a shower head structure, installed at a ceiling portion of the processing chamber, having a plurality of gas jetting holes formed on a gas jetting surface to inject a processing gas into the processing chamber, the gas jetting surface facing toward an inside of the processing chamber; and a mounting table installed in the processing chamber to face toward the shower head structure, wherein a head distance between the gas jetting surface and the mounting table (conventionally, defined irrespective of a thickness of an object to be processed) and a gas jetting velocity from the gas jetting holes are restricted to be within an area in a plane coordinates system having the head distance as a horizontal axis and the gas jetting velocity as a vertical axis, the area being surrounded by a quadrilateral shape formed by connecting four points including a point where the gas jetting velocity is 32 m/sec and the head distance is 15 mm; a point where the gas jetting velocity is 67 m/sec and the head distance is 15 mm; a point where the gas jetting velocity is 40 m/sec and the head distance is 77 mm; and a point where the gas jetting velocity is 113 m/sec and the head distance is 77 mm.

In accordance with the present invention, if a gas jetting velocity from gas jetting holes of the shower head structure is set such that a head distance between the shower head structure and the mounting table is within an optimal range, a throughput can be increased by improving a processing efficiency while maintaining a high level of within wafer uniformity of a processing.

For example, the gas jetting holes of the gas jetting surface is formed in a forming area of a circular shape and an object to be processed loaded on the mounting table is also formed of a circular shape.

In this case, a diameter of the forming area of the gas jetting holes in the gas jetting surface is preferably set to be equal to or smaller than a diameter of the object to be processed to thereby further enhance the level of the within wafer uniformity of a processing.

In particular, the diameter of the forming area of the gas jetting holes in the gas jetting surface is preferably 70% to 100% of the diameter of the object to be processed.

Preferably, the processing gas contains ozone for reforming a metal oxide film formed on a surface of the to-be-processed object.

Moreover, preferably, the metal oxide film is a tantalum oxide film.

Further, in accordance with another aspect of the present invention, there is provided a processing method for processing an object to be processed by using a processing apparatus including a processing chamber; a shower head structure, installed at a ceiling portion of the processing chamber, having a plurality of gas jetting holes formed on a gas jetting surface thereof to inject a processing gas into the processing chamber, the gas jetting surface facing toward an inside of the processing chamber; and a mounting table installed in the processing chamber to face toward the shower head structure, the method including the steps of: restricting a head distance between the gas jetting surface and the mounting table and a gas jetting velocity from the gas jetting holes to be within an area in a plane coordinates system having the head distance as a horizontal axis and the gas jetting velocity as a vertical axis, the area being surrounded by a quadrilateral shape formed by connecting four points including a point where the gas jetting velocity is 32 m/sec and the head distance is 15 mm; a point where the gas jetting velocity is 67 m/sec and the head distance is 15 mm; a point where the gas jetting velocity is 40 m/sec and the head distance is 77 mm; and a point where the gas jetting velocity is 113 m/sec and the head distance is 77 mm; loading the object to be processed on the mounting table; and introducing the processing gas through the gas jetting holes into the processing chamber.

Preferably, the processing gas contains ozone for reforming a metal oxide film formed on a surface of the object to be processed.

Further, preferably, the metal oxide film is a tantalum oxide film.

DETAILED DESCRIPTION OF THE PREFERRED EMBODIMENT

Hereinafter, a processing apparatus and a processing method in accordance with a preferred embodiment of the present invention will be described with reference to the accompanying drawings.

Figure 1:
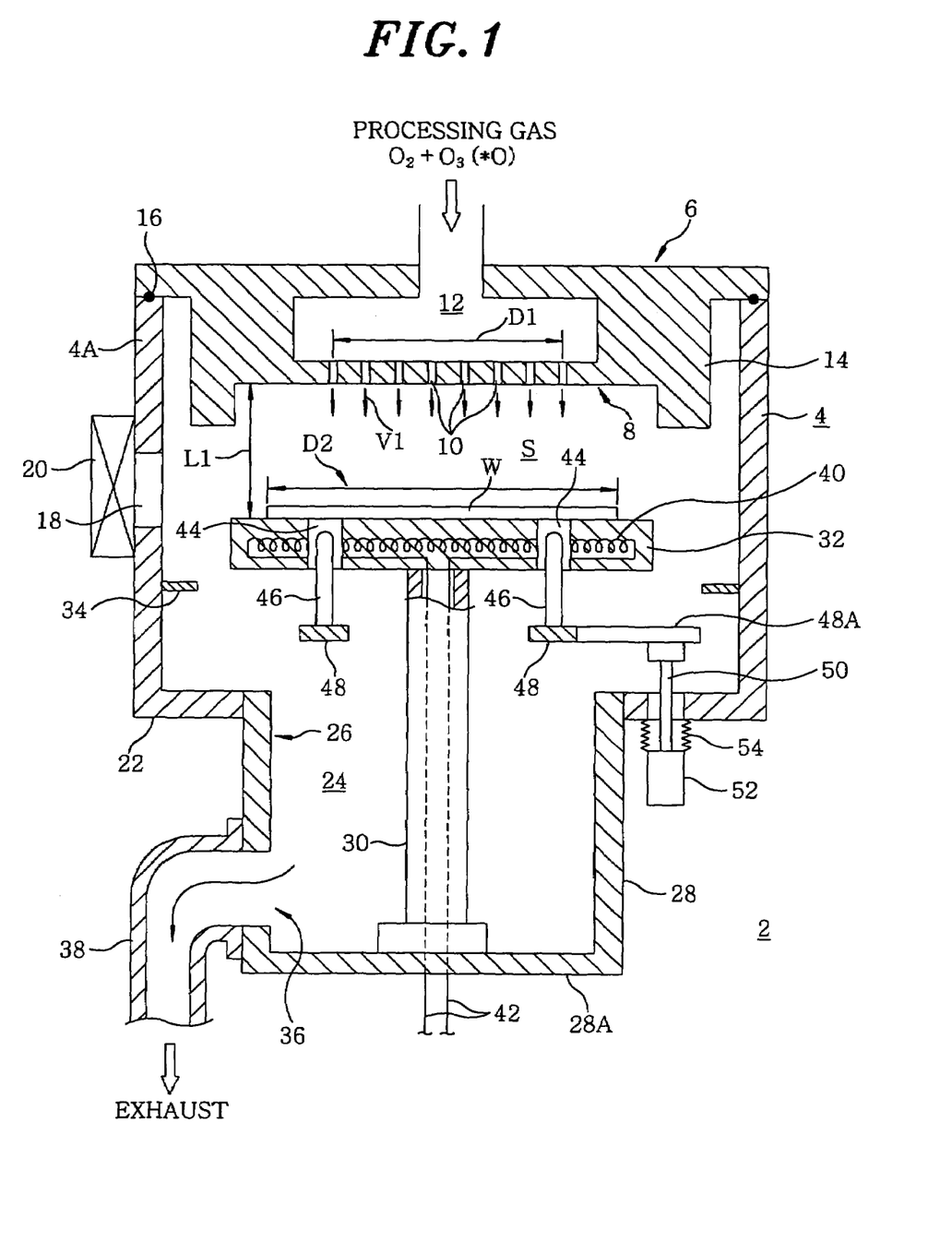
FIG. 1 is a cross sectional view of a processing apparatus in accordance with a preferred embodiment of the present invention.
Figure 2:
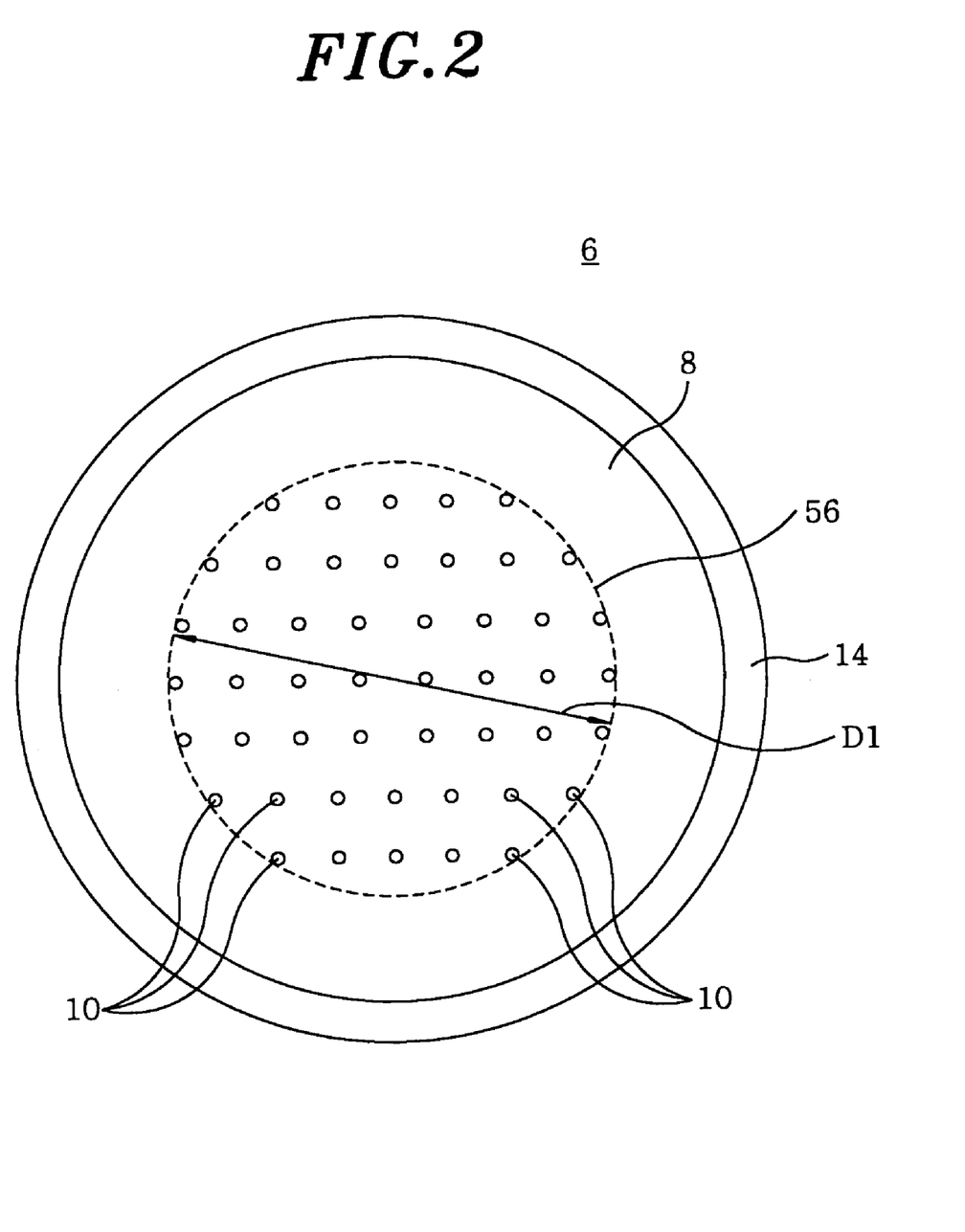
FIG. 2 provides a bottom view of a shower head structure shown in FIG. 1.
Figure 3:
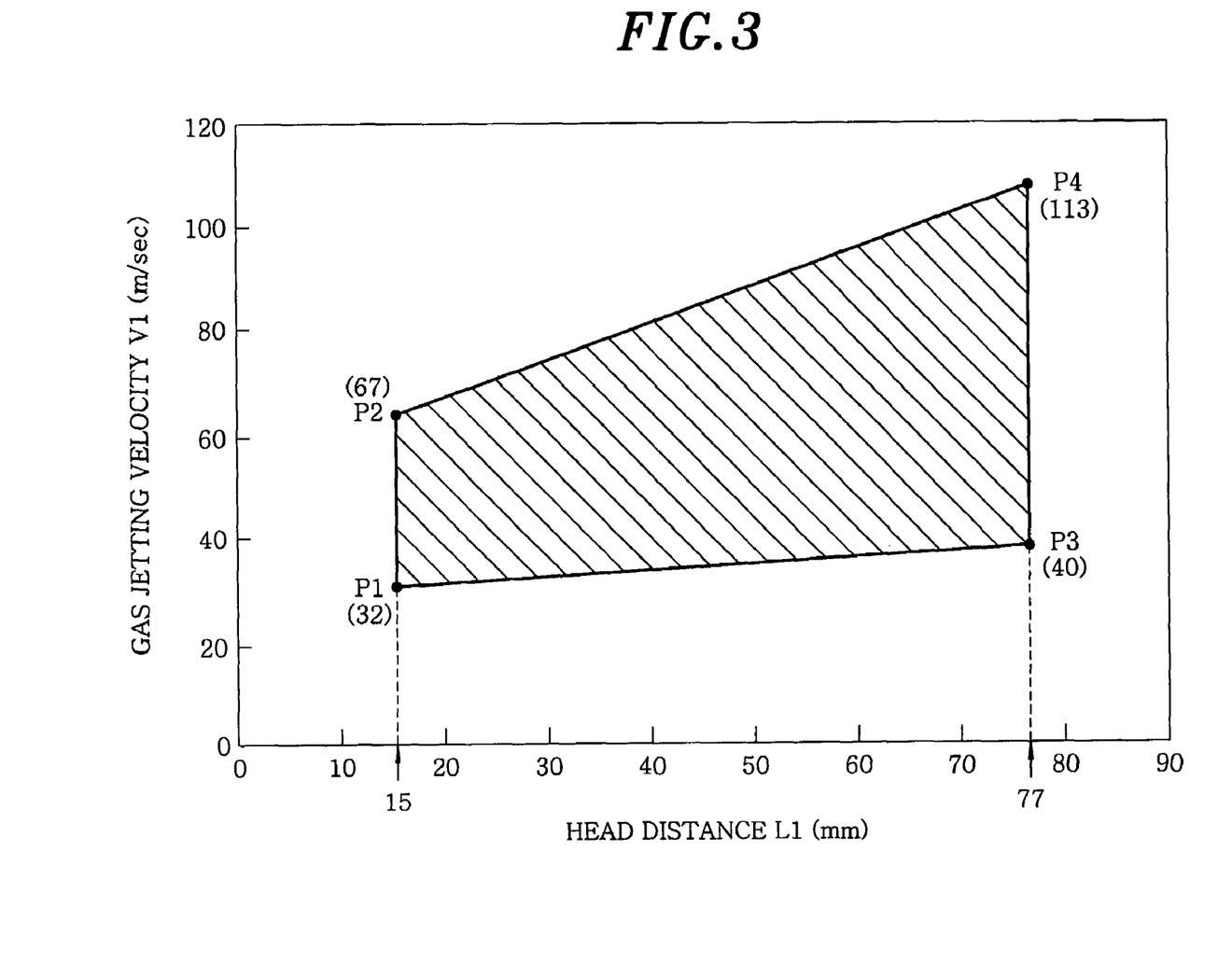
FIG. 3 explains an optimum range relationship between a gas jetting velocity and a head distance.

FIG. 1 shows a cross sectional view of the processing apparatus in accordance with the preferred embodiment of the present invention. FIG. 2 provides a bottom view of a shower head structure shown in FIG. 1. FIG. 3 presents a graph for describing an optimal range of a gas jetting velocity as a function of a head distance. The processing apparatus of this preferred embodiment is the one for reforming tantalum oxide films through an annealing process.

As shown in FIG. 1, a processing apparatus 2 has a processing chamber 4 made of aluminum and an inside of the processing chamber 4 is approximately of a cylindrical shape. Installed on a ceiling portion of the processing chamber 4 is a shower head structure 6 functioning as a gas supply unit for introducing a required processing gas, e.g., a mixture gas of $O_2$ and $O_3$, or a mixture gas thereof further having active species of oxygen *O. A gas jetting surface 8 of a bottom surface of the shower head structure 6 has a plurality of gas jetting holes 10, so that the processing gas is injected through the plurality of gas jetting holes 10 toward a processing space S.

A gas diffusion room 12 of a hollow shape is formed inside the shower head structure 6. The processing gas is horizontally diffused in the gas diffusion room 12 and then injected through each of the gas jetting holes 10. The entire shower head structure 6 is formed of, e.g., nickel, a nickel alloy of Hastelloy (registered trademark) or the like, aluminum or an aluminum alloy. A ring-shaped guide protrusion 14 projecting downward is formed along a periphery of the gas jetting surface 8 of the shower head structure 6 in order to guide a downward flow of the processing gas. In addition, a sealing member 16 made of, e.g., an O-ring is provided at an abutment of the shower head structure 6 and an open top of the processing chamber 4, thereby helping to maintain the inside of the processing chamber 4 airtight.

Formed on a sidewall 4A of the processing chamber 4 is a gate 18 through which an object processed or to be processed, i.e., a semiconductor wafer W, is carried into and out of the processing chamber 4. Installed at the gate 18 is a gate valve 20 capable of being airtightly opened and closed.

Further, an exhaust gas downdraft space 24 is formed at a bottom portion 22 of the processing chamber 4. Specifically, a large entrance opening 26 is provided at a central portion of the bottom portion 22 of the processing chamber 4 and the entrance opening 26 is connected to a downwardly extending cylindrical enclosure wall 28 of a cylindrical shape having a bottom surface, which includes therein the exhaust gas downdraft space 24. A support 30 of, e.g., a cylindrical shape stands on a bottom portion 28A of the cylindrical enclosure wall 28 enclosing the exhaust gas downdraft space 24. A mounting table 32 is fixed on top of the support 30.

A diameter of the entrance opening 26 of the exhaust gas downdraft space 24 is set to be smaller than that of the mounting table 32. Thus, a processing gas flowing downward along an outer region of the periphery of the mounting table 32 curves inward under the mounting table 32 and then flows into the entrance opening 26. Further, installed on an inner wall of the processing chamber 4 is a ring-shaped guide plate 34 inwardly protruding toward a bottom area of the mounting table 32. Thus, atmosphere being exhausted is guided toward the entrance opening 26 by the ring-shaped guide plate 34. An exhaust port 36 communicating with the exhaust gas downdraft space 24 is formed on a bottom sidewall of the cylindrical enclosure wall 28. The exhaust port 36 is connected to an exhaust line 38 where a vacuum pump (not shown) is installed to thereby make it possible to exhaust the atmosphere of the processing chamber 4 and the exhaust gas downdraft space 24.

A pressure control valve (not shown) whose opening can be controlled is installed on the exhaust line 38. By automatically controlling the degree of opening of the pressure control valve, a pressure inside the processing chamber 4 can be maintained at a constant level or rapidly changed into a desired pressure.

The mounting table 32 is provided with a heating device, e.g., a resistance heater 40 disposed in a predetermined pattern inside the mounting table 32. An outer portion of the mounting table 32 is made of a sintered ceramic composed of, e.g., AlN or the like. Further, a semiconductor wafer W, i.e., an object to be processed, can be loaded on a top surface of the mounting table 32. The resistance heater 40 is connected to feeder lines 42 disposed inside the support 30. Therefore, it is possible to control power applied to the resistance heater 40.

The mounting table 32 is provided with a plurality of, e.g., three, pin insertion through holes 44 (only two are shown in FIG. 1) vertically running therethrough. Inserted through each of the pin insertion through holes 44 is a vertically movable upthrust pin 46. A bottom portion of the upthrust pin 46 is connected to an upthrust ring 48 made of ceramic such as alumina and formed in an arc shape obtained by partially cutting a circular ring. That is, a top surface of the upthrust ring 48 supports the bottom of each upthrust pin 46. An arm unit 48A extending from the upthrust ring 48 is connected to an up/down rod 50 passing through the bottom portion 22 of the processing chamber 4 and the up/down rod 50 is configured to be vertically moved by an actuator 52. Accordingly, when loading and unloading the wafer W, each upthrust pin 46 is vertically moved up or down from a top portion of each pin insertion through hole 44. Further, an expansible/contractible bellows 54 is installed between the actuator 52 and a portion of the bottom potion 22 of the processing chamber 4 through which the up/down rod 50 of the actuator 52 passes. Therefore, the up/down rod 50 can be vertically movable while keeping the inside of the processing chamber 4 airtight.

The following is a detailed description of the shower head structure 6 featuring the present invention. As illustrated in FIG. 2, in the shower head structure 6, a plurality of gas jetting holes 10 are formed in an approximately circular area in a substantially uniformly distributed fashion. An inner diameter of each of the gas jetting holes 10 ranges from, e.g., about 0.4 to 0.8 mm and the number of the gas jetting holes 10 ranges from about 50 to 800. It has been found by the inventors of the present invention that a diameter D1 of a circular forming area 56 in which the gas jetting holes 10 are formed is preferably smaller than or equal to a diameter D2 (see FIG. 1) of the semiconductor wafer W. Preferably, the diameter D1 of the forming area 56 is set to be in a range from 70% to 100% of the diameter D2 of the wafer W.

When a head distance L1 in this embodiment is defined as a distance between the gas jetting surface 8 and a placing surface 32A of the mounting table 32, there is a relationship between the head distance L1 and a gas jetting velocity V1 from the gas jetting holes 10 that is restricted to hold in a shaded area as shown in a graph of FIG. 3, i.e., the area being encompassed by a quadrilateral formed by connecting the following four points by straight lines: a point where the head distance L1 and the gas jetting velocity V1 are 15 mm and 32 m/sec, respectively; a point, 15 mm and 67 m/sec; a point, 77 mm and 40/sec; and a point, 77 mm and 113 m/sec.

By restricting the relationship between the head distance L1 and the gas jetting velocity V1 to hold within the shaded area shown in FIG. 3, a surface velocity of gas flow on a wafer surface can be optimized to thereby maintain a high level of within wafer uniformity of a processing and improve processing efficiency and throughput, as will be described later.

Hereinafter, an operation of the processing apparatus having the aforementioned structure will be described.

Before the semiconductor wafer W is loaded into the processing chamber 4, an inner space of the processing chamber 4 of the processing apparatus 2 connected to a load lock chamber (not shown) is, e.g., evacuated. Further, the mounting table 32 for loading thereon the wafer W is heated by the resistance heater 40 acting as a heating device up to a predetermined temperature, which is then stably maintained at the temperature.

Next, the semiconductor wafer W to be processed is loaded into the processing chamber 4 by a transfer arm (not shown) through the gate valve 20 that is opened and the gate 18. The wafer W is placed on the upthrust pin 46 that has been lifted. Then, the upthrust pin 46 moves downward, so that the wafer W can be loaded and supported on a top surface of the mounting table 32. A surface of the wafer W made of a silicon substrate of this preferred embodiment is coated with a metal oxide film, e.g., a tantalum oxide film, formed in a preceding process.

Thereafter, a processing gas including, e.g., $O_2$ and $O_3$ is supplied to the shower head structure 6 at a controlled flow rate. The gas is spurted (jetted) from the gas jetting holes 10 to be introduced into the processing space S. Further, a vacuum pump (not shown) provided at the exhaust line 38 is kept operating continuously to maintain the vacuum state in the processing chamber 4 and the exhaust gas downdraft space 24. Moreover, by controlling an opening degree of the pressure control valve, the atmosphere of the processing space S can be maintained at a predetermined operating process pressure. At this time, a temperature of the wafer W is maintained at, e.g., about 660° C., and, therefore, the tantalum oxide film on the surface of the semiconductor wafer W is annealed to be reformed by $O_2$, $O_3$, or the like.

As described above, the relationship between the head distance L1 and the gas jetting velocity V1 from the gas jetting holes 10 is restricted to hold within a shaded area as shown in a graph of FIG. 3, i.e., the area encompassed by a quadrilateral formed by connecting the following points by straight lines: a point P1 where the head distance L1 and the gas jetting velocity V1 are 15 mm and 32 m/sec, respectively; a point P2, 15 mm and 67 m/sec; a point P3, 77 mm and 40/sec; and a point P4, 77 mm and 113 m/sec.

By restricting the relationship between the head distance L1 and the gas jetting velocity V1 to hold within the shaded area shown in FIG. 3, a surface velocity of gas flow on the wafer surface can be optimized to thereby maintain a high level of within wafer processing uniformity and improve processing efficiency and throughput.

The following is a detailed description thereof.

Figure 4:
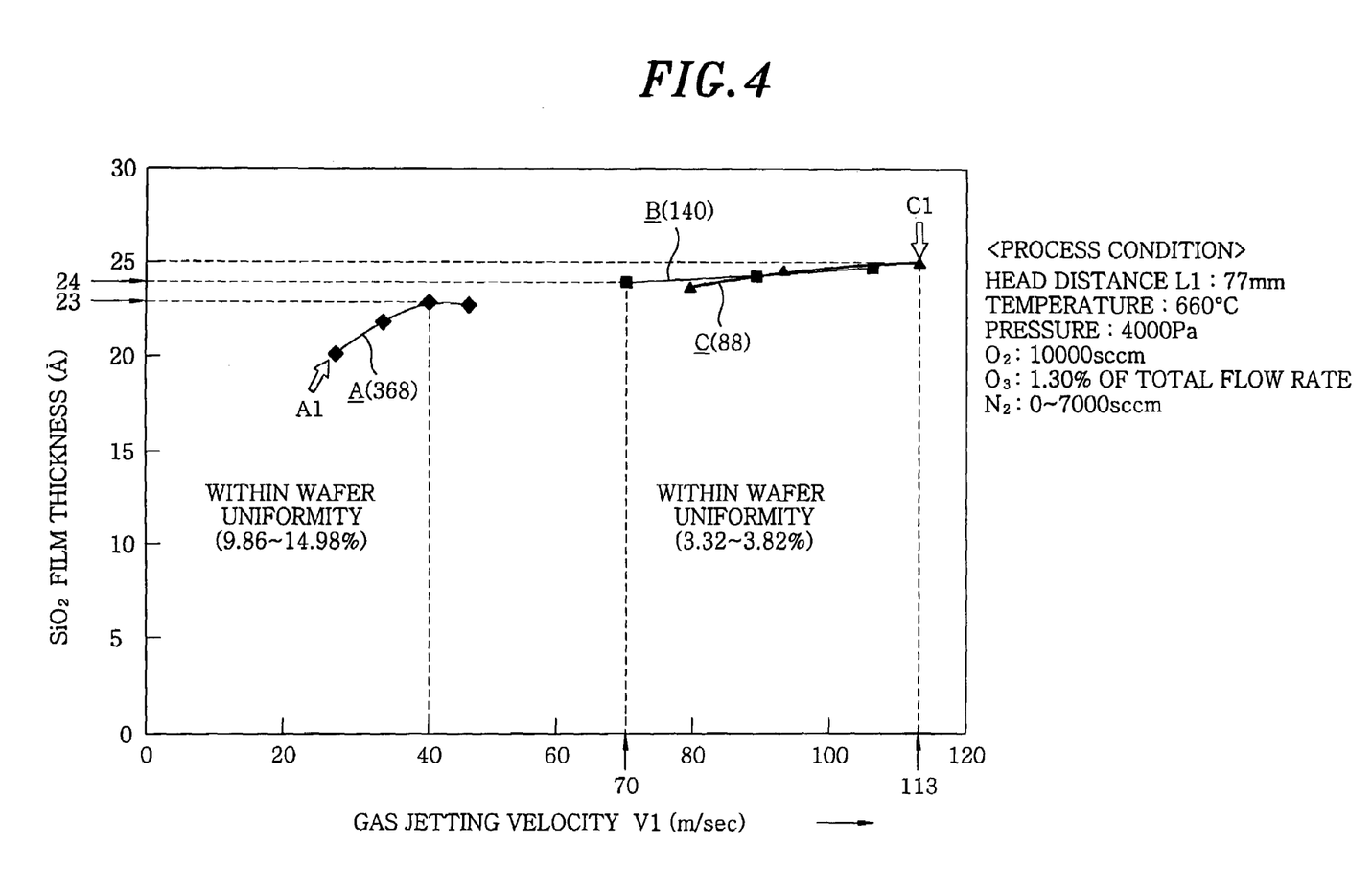
FIG. 4 sets forth a graph for describing a relationship between a gas jetting velocity when performing a reforming process by annealing and a thickness of a $SiO_2$ film (processed for 5 minutes) formed during the process.
Figure 5:
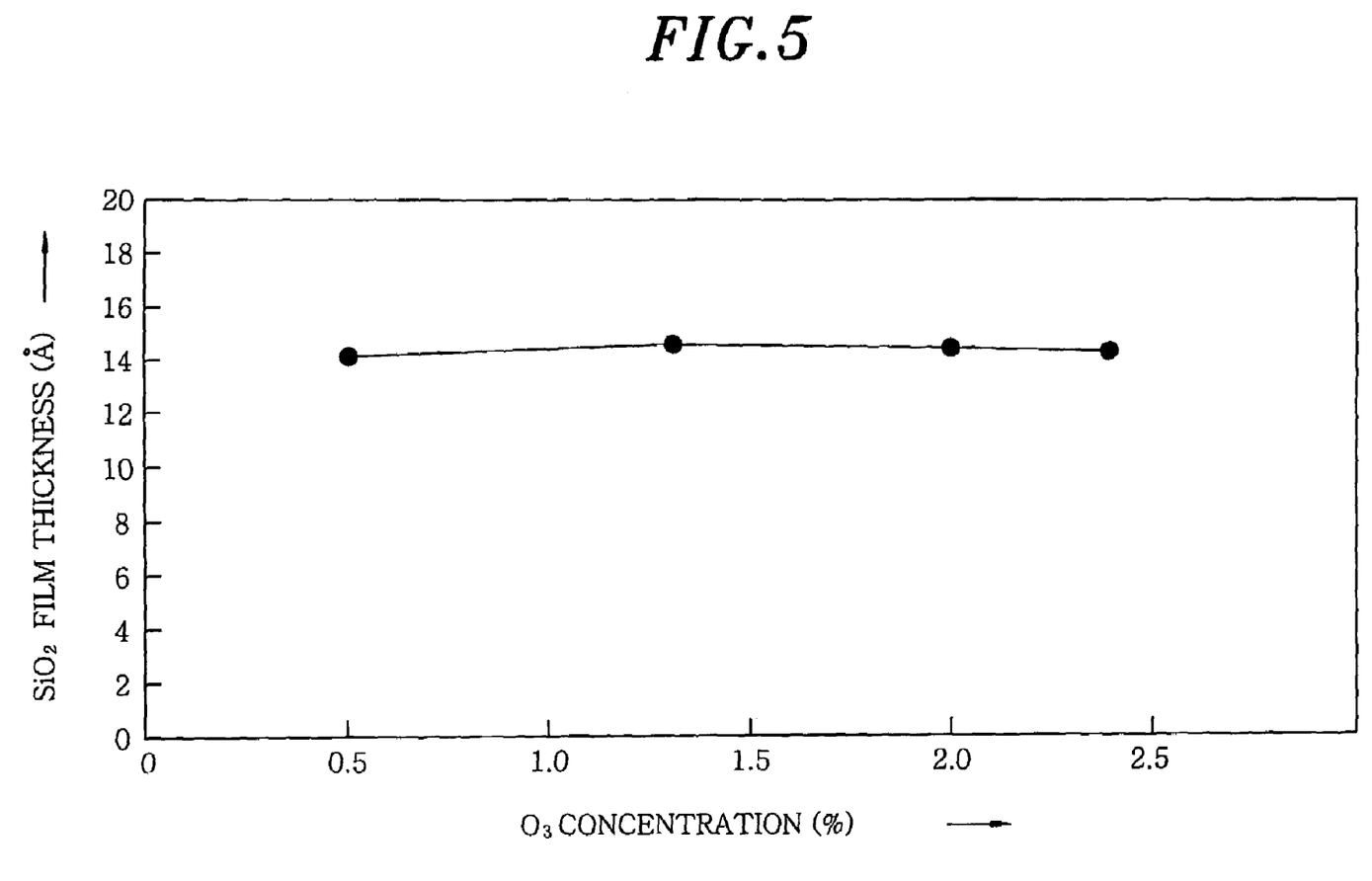
FIG. 5 depicts a graph showing a relationship between an $O_3$ concentration and a $SiO_2$ film thickness.
Figure 6:
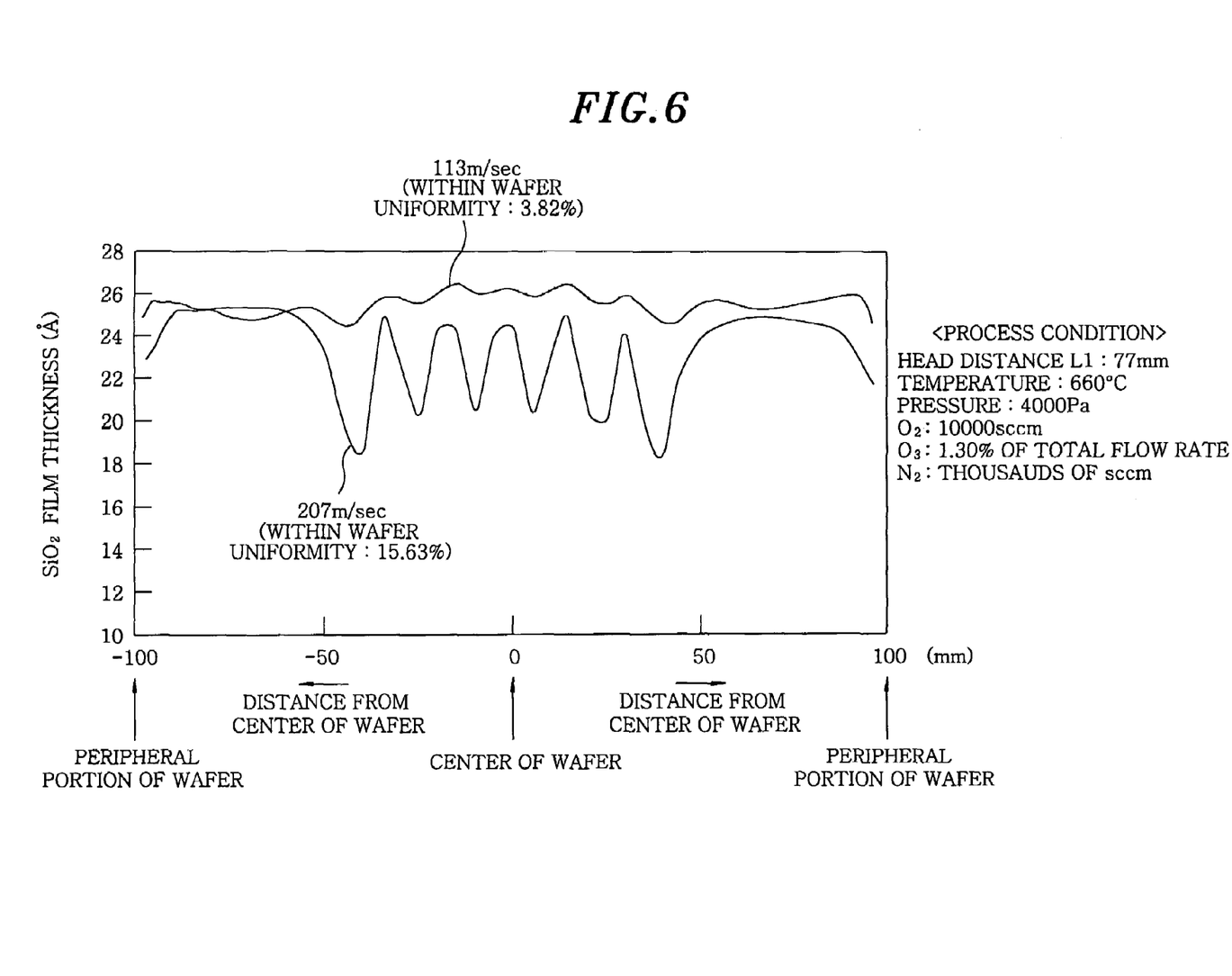
FIG. 6 provides a graph for describing an upper limit of a gas jetting velocity in case a head distance is 77 mm.

FIG. 4 presents a graph showing a relationship between a gas jetting velocity and the $SiO_2$ film thickness when a semiconductor wafer made of a silicon substrate having a diameter of 200 mm was annealed to perform a reforming processing. FIG. 5 represents a graph illustrating a relationship between an $O_3$ concentration and the $SiO_2$ film thickness. FIG. 6 provides a graph for explaining a maximum value of the gas jetting velocity in case the head distance is 77 mm.

As illustrated in FIG. 4, a relationship between the gas jetting velocity V1 from the gas jetting holes 10 of the shower head structure 6 and the $SiO_2$ film thickness was examined in order to evaluate a reforming performance. The size of the used wafer was 200 mm and the head distance L1 was 77 mm. Further, a process temperature and a process pressure were about 660° C. and about 30 Torr (4000 Pa), respectively. In curves A and B of FIG. 4, a flow rate of $O_2$ gas was constant at 10000 sccm, and 1.30% of a total flow rate was replaced with an $O_3$ gas. Moreover, an $N_2$ gas was added within the range of 0 to 7000 sccm in order to change the jetting velocity. In addition, in a curve C of FIG. 4, a flow rate Of $O_2$ gas varied from 7000 to 10000 sccm, and 1.30% of a total flow rate was replaced with an $O_3$ gas. However, an $N_2$ gas was not added.

Herein, the reforming performance is evaluated based on a thickness of a $SiO_2$ film (film forming rate) since the film forming rate of the $SiO_2$ film increases as the reforming performance is improved and therefore, in a reforming processing performed for an equal processing time, it can be determined that a thicker $SiO_2$ film represents an improved reforming performance.

In order to vary the gas jetting velocity V1, a flow rate of $O_2$ or $N_2$ gas was changed. In this case, an $O_3$ concentration as well as the gas jetting velocity V1 is also changed. However, as illustrated in FIG. 5, since a relationship between the $SiO_2$ film thickness and the $O_3$ concentration is substantially flat at least within a range of the concentration of $O_3$ used in this preferred embodiment, it can be seen that the dependency of $O_3$ concentration on the $SiO_2$ film thickness is very small. Therefore, a variation in the film forming rate of the $SiO_2$ film shown in FIG. 4 can be regarded as being dependent on the gas jetting velocity V1, as will be explained below. In FIG. 5, the $O_3$ concentration varies within the range from 0.5 to 2.5%.

The gas jetting velocity V1 is represented by a following equation.

$$V1 = Q \cdot (273+T)/(K \cdot A \cdot P \cdot 273)$$

Q: a gas flow rate (sccm)
A: a total area ($m^2$) of all the gas jetting holes of the shower head
P: a pressure (Pa) at the gas jetting holes of the shower head
T: a temperature (° C.) of the shower head
K: a conversion constant=592

In case of data plotted on the curve A of FIG. 4, an inner diameter and the number of the gas jetting holes 10 were 0.8 mm and 368, respectively. These data corresponds to a conventional shower head structure. Especially, a conventional reforming annealing process is performed under the condition represented by a leftmost point A1 among the data on the curve A.

In case of data plotted on the curve B, an inner diameter and the number of the gas jetting holes 10 were 0.8 mm and 140, respectively. In case of data plotted on the curve C, an inner diameter and the number of the gas jetting holes 10 were 0.8 mm and 88, respectively. The shower head structures whose respective numbers of the gas jetting holes 10 are 140 and 88 can be respectively obtained by sealing the gas jetting holes 10 within a certain distance from the outermost peripheral region in the conventional shower head structure.

As can be clearly seen from the graph of FIG. 4, an increase in the gas jetting velocity V1 generally raises the thickness of the $SiO_2$ film (film forming rate) formed by the reforming processing.

In the conventional shower head structure corresponding to the curve A, a film thickness at point A1 was about 20 Å. Until the gas jetting velocity V1 reaches to about 40 m/sec, the film thickness increases as the gas jetting velocity increases. However, even if the gas jetting velocity V1 is increased further, the film thickness is saturated at about 23 Å and there is no further increase.

On the contrary, when the gas jetting velocity V1 was increased to a higher level corresponding to the curves B or C by reducing the number of gas jetting holes 10, the $SiO_2$ film thickness was increased to reach about 24 to 25 Å when the gas jetting velocity was in the range between 70 and 113 m/sec, so that a higher film forming rate could be achieved. Considering an upper limit of film forming rate during five minutes is 20 Å at a point A1 corresponding to a conventional gas jetting velocity in a conventional case where the number of the gas jetting holes 10 is 368, a new and preferable lower limit of the gas jetting velocity V1 is determined to be about 40 m/sec corresponding to the $SiO_2$ film thickness of 23 Å.

More preferably, the lower limit of the gas jetting velocity V1 is about 70 m/sec corresponding to the film forming rate of 24 Å during five minutes, which cannot be achieved in the conventional shower head structure.

Next, an upper limit of the gas jetting velocity V1 was examined.

As shown in FIG. 6, the $SiO_2$ film thicknesses in a radial direction of a wafer were investigated in case the gas jetting velocities V1 were 113 m/sec (corresponding to a point C1 of FIG. 4) and 207 m/sec, respectively. Other processing conditions were same as those explained with reference to FIG. 4.

As illustrated in FIG. 6, in case the gas jetting velocity was 113 m/sec, irregularities in the film thickness were not so serious and the within wafer uniformity thereof showed a satisfactory result of 3.82%. On the other hand, in case of an excessively high gas jetting velocity of 207 m/sec, film thicknesses in regions corresponding to the gas jetting holes 10 became extremely thin (because pattern of the gas jetting holes were printed [transferred]), thereby generating large overall irregularities.

Thus, in case the gas jetting velocity was 207 m/sec, the uniformity in the film thickness was deteriorated down to 15.63%, resulting in producing an unsatisfactory film. The reason why the film forming rate is increased as the gas jetting velocity V1 is increased is presumed that the increase in the gas jetting velocity V1 results in an increase in a surface velocity of gas on the wafer surface, which in turn causes an oxidizing power of $O_2$ gas and $O_3$ gas for tantalum oxide film to be augmented.

Resultantly, in case the head distance L1 is 77 m, an upper and a low limit of a new and preferable gas jetting velocity V1 are considered to be 113 m/sec and 40 m/sec, respectively.

Further, as shown in FIG. 4, the within wafer uniformity of film thickness under conditions corresponding to the curve A was about 9.86 to 14.98%, which is not so good; but those under the conditions corresponding to the curves B and C were very good, falling in the range from about 3.32 to 3.82%.

Furthermore, the forming area 56 (see FIGS. 1 and 2) on which 140 (curve B) or 88 (curve C) gas jetting holes 10 are provided has a diameter D1, which is smaller than or equal to a diameter D2 of the wafer W. For example, the diameter D1 is set to range from about 70% to 100% of the diameter D2. Resultantly, the within wafer uniformity of film thickness is further more improved. In case the number of the gas jetting holes 10 is 386 (curve A), the diameter D1 of the forming area 56 was set to be slightly larger than the diameter D2 of the wafer W.

Figure 7A:
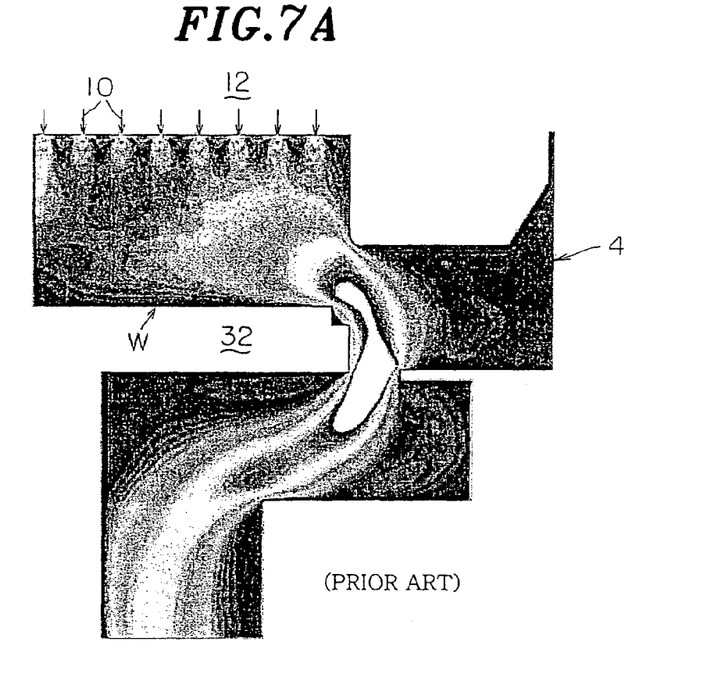
FIG. 7A provides a simulation result of a gas jetting velocity distribution of gas, which is injected from a shower head structure of a conventional processing apparatus, in a processing space
Figure 7B:
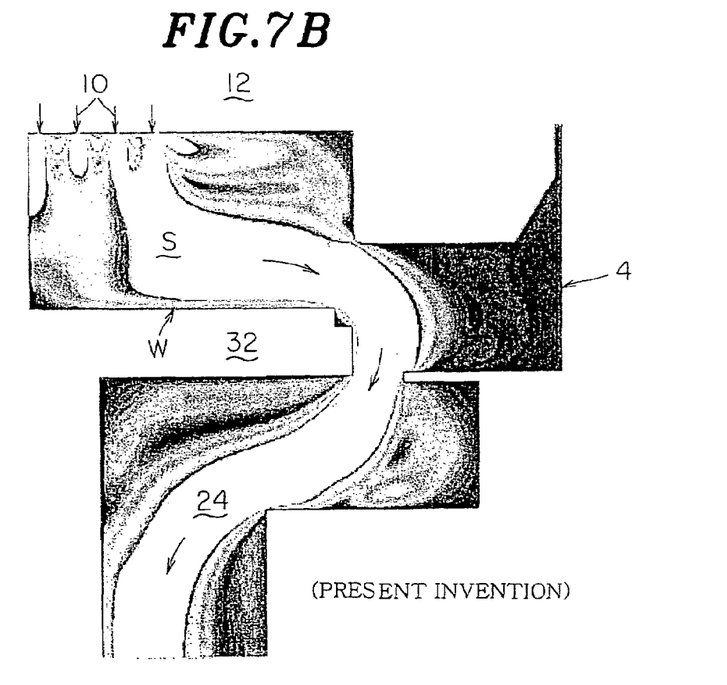
FIG. 7B shows a simulation result of a gas jetting velocity distribution of gas, which is injected from the shower head structure of the processing apparatus of the present invention, in a processing space.

A distribution of gas flow velocities in the processing space was simulated for each of two cases where a shower head structure of a conventional processing apparatus and a shower head structure of the processing apparatus of the present invention are employed to inject a gas. The simulation result is as follows.

FIGS. 7A and 7B are graphs, each representing the simulation result of a right half portion within a processing chamber. FIG. 7A illustrates a flow velocity distribution of a gas injected from the shower head structure of the conventional processing apparatus, which corresponds to the curve A in FIG. 4. FIG. 7B shows a flow velocity distribution of a gas injected from the shower head structure of the present invention, which corresponds to the curves B or C in FIG. 4. In the drawings, a whiter portion represents a region of a higher gas jetting velocity.

In case of the conventional processing apparatus, as shown in FIG. 7A, a gas flow velocity is not so high on the surface of the wafer W and is large only at a peripheral portion of the wafer W. On the other hand, the processing apparatus of the present invention has a high gas flow velocity on almost entire surface region of the wafer W, as shown in FIG. 7B.

The processing apparatus of the present invention described above was the one applicable to a wafer having a size of 200 mm and had a head distance L1 of about 77 mm. However, the wafer size is not limited to 200 mm. For example, the present invention can be applied to a processing apparatus for treating a wafer of a size of 300 mm. In case of the processing apparatus for a wafer of a size of 300 mm, a diameter of each of the mounting table 32 and the shower head structure 6 is increased to match the increase in the wafer size. However, the head distance L1 can be conversely set to be smaller, for example, about 15 mm, to cope with a demand for a size reduction of a processing apparatus.

The same experiment as described above was conducted for the processing apparatus for the wafer of 300 mm in case a head distance L1 was 15 mm. As a result, it was found that a new and a preferable upper limit of the gas jetting velocity V1 was about 67 m/sec, i.e., lower than the upper limit of 113 m/sec in the processing apparatus for treating the wafer having a size of 200 mm. It is presumed that a reduction in the head distance L1 from 77 mm to 15 mm facilitates the print (transfer). Further, the lower limit of the gas jetting velocity in this case was found to be about 32 m/sec, when a minimum value of a film forming rate for a time period of 5 minutes is about 23 Å, preferably about 40 m/sec.

In this case, the number of the gas jetting holes 10 was 761 and their diameter was set to be 0.4 mm in order to maintain a high flow velocity and restrain the print while achieving a uniform flow thereof. Further, a process temperature and a process pressure were set to be respectively 660° C. and 30 Torr (4000 Pa). A flow rate of $O_2$ gas was varied within a range from 6000 to 10000 sccm while a flow rate of $N_2$ gas was changed within a range from 0 to about 9000 sccm, in order to change the gas jetting velocity V1. Further, a gas flow rate of $O_3$ was changed within a range from 0.68% to 2.17% of the total flow rate.

Figure 8:
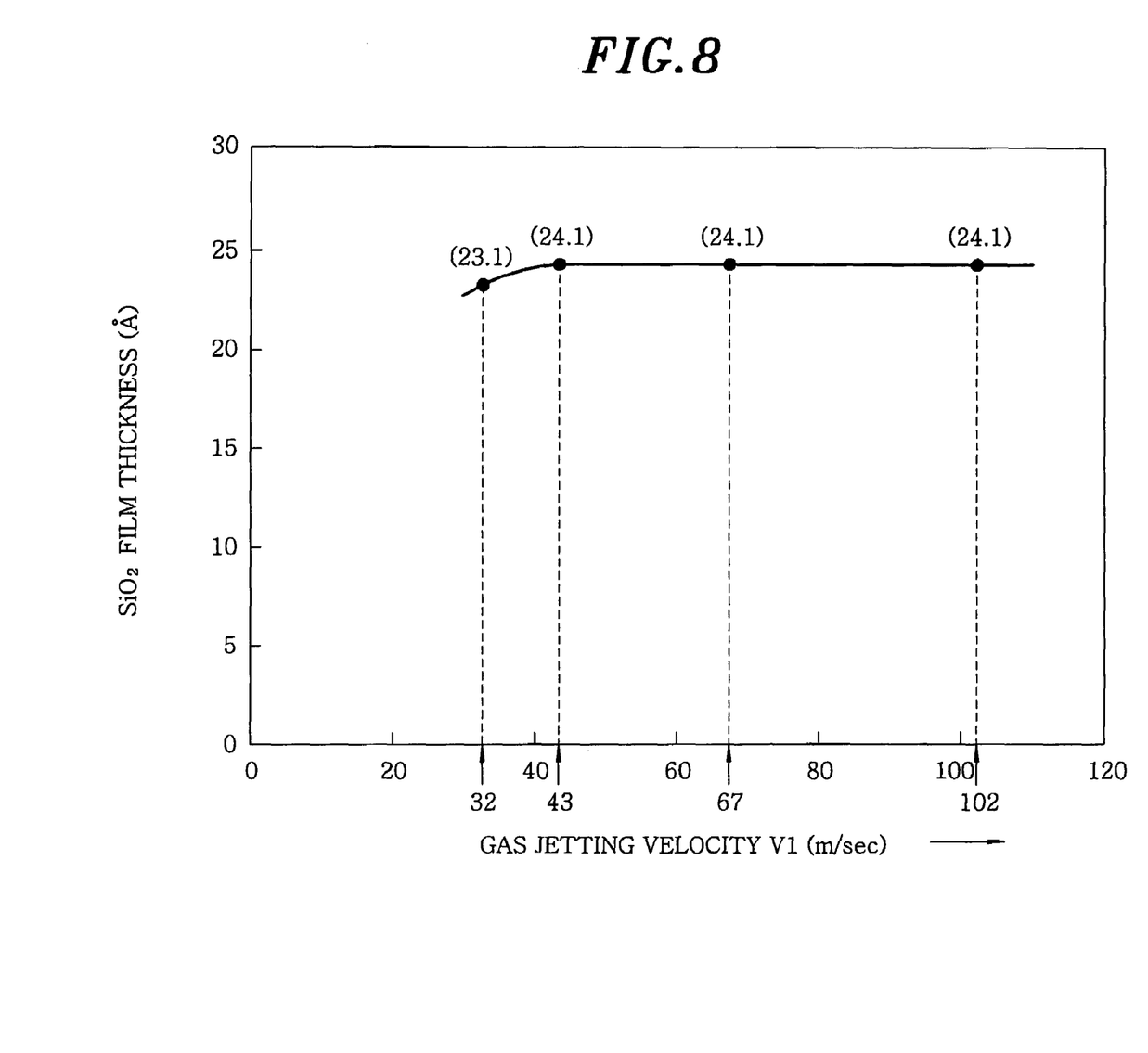
FIG. 8 is a graph describing a relationship between a gas jetting velocity and a thickness of a $SiO_2$ film (processed for 5 minutes)

FIG. 8 is a graph for describing a relationship between a gas jetting velocity V1 and a thickness of a $SiO_2$ film (processed for 5 minutes). As shown in FIG. 8, a film forming rate higher than the conventional film forming rate of 20 Å (corresponding to point A1 in FIG. 4) was achieved over an entire range of gas jetting velocity from 32 m/sec to 102 m/sec. Further, a flow rate of $O_2$ gas needs to be set smaller than or equal to 6000 sccm in a range of a gas jetting velocity V1 smaller than 32 m/sec. Since, however, an ozone generation from an ozone generator may not be performed stably in case the flow rate of $O_2$ gas is reduced, data in this range could not be obtained.

Figure 9:
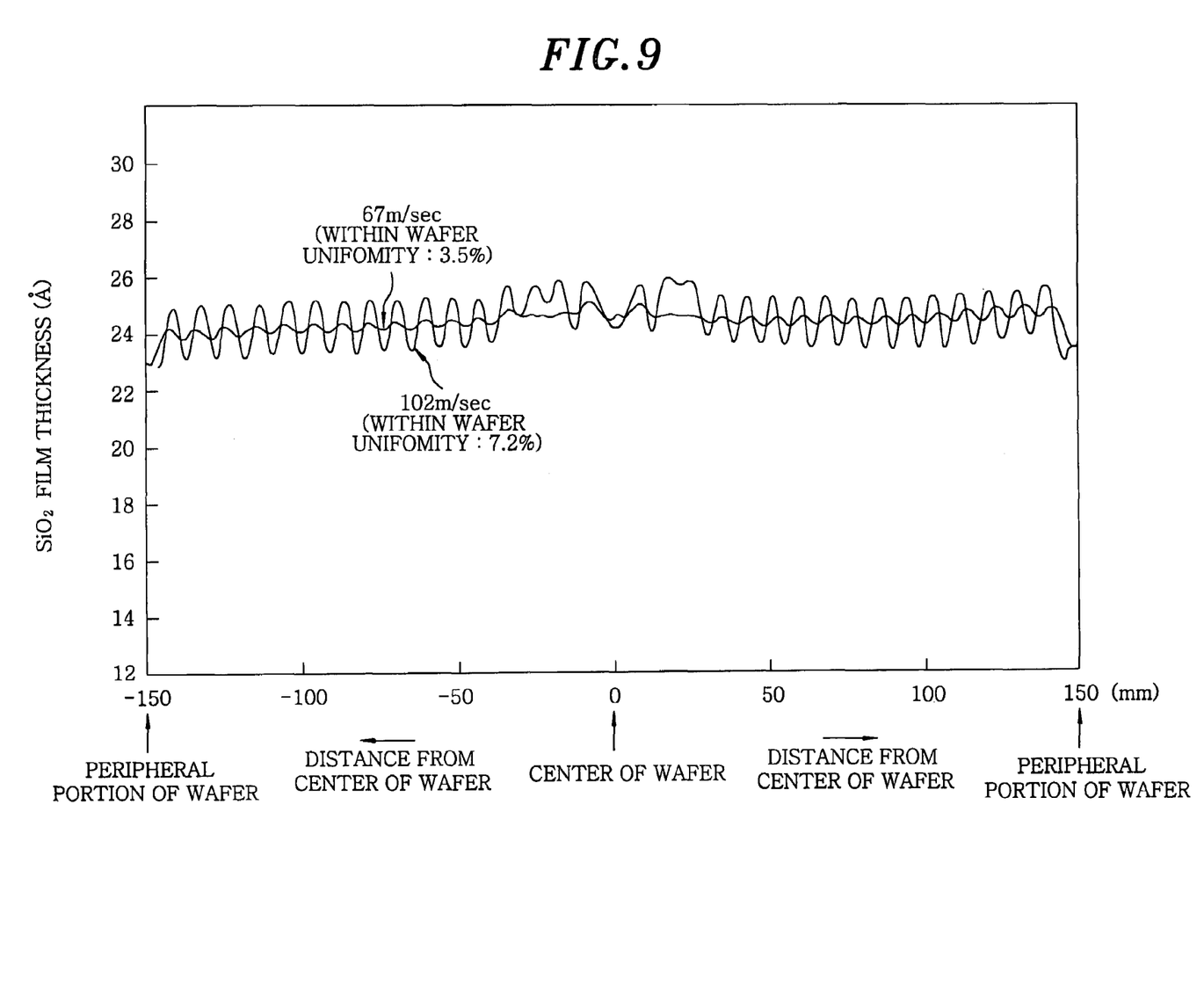
FIG. 9 explains an upper limit of a gas jetting velocity in case a head distance is about 15 mm.

Further, FIG. 9 is a graph for describing an upper limit of gas jetting velocity in case a head distance is 15 mm. As shown therein, irregularities in the film thickness was not so serious and the within wafer uniformity of the film thickness showed a good result of 3.5% in case a gas jetting velocity V1 is 67 m/sec. In contrast, in case the gas jetting velocity V1 was 102 m/sec, there occurred a serious print, resulting in large irregularities and an unsatisfactory within wafer uniformity of a film thickness of 7.2%. Therefore, the upper limit of gas jetting velocity V1 can be regarded as 67 m/sec.

The lower limit of gas jetting velocity V1 is 32 m/sec at the maximum, though a smaller value is expected. Therefore, the shaded area surrounded by a quadrilateral formed by connecting the points P1 to P4 in FIG. 3 is a proper area. Further, if a processing apparatus having a head distance smaller than 15 mm is developed by technological innovation, the proper range of gas jetting velocity is expected to be further extended to a left area in FIG. 3.

As described above, it was found that the shaded area surrounded by the quadrilateral formed by connecting the points P1, P2, P4 and P3 was an area of optimum conditions for the reforming annealing processing.

By arbitrarily setting the head distance L1 and the gas jetting velocity V1 within the shaded area shown in FIG. 3, the within wafer processing uniformity can be maintained to be at a high level while improving efficiency of the processing and throughput thereof.

Furthermore, diameters and the numbers of the gas jetting holes 10 in the preferred embodiment are mere representation of examples and thus are not limited thereto.

Still further, though the processing apparatus for the reforming annealing process of a tantalum oxide film has been disclosed in the preferred embodiment of the present invention, the present invention can be applied to a thermal CVD processing apparatus, a plasma CVD processing apparatus, an etching processing apparatus, an oxidation diffusion processing apparatus, a sputtering processing apparatus, and the like.

Furthermore, though the preferred embodiment employs a semiconductor wafer as the object to be processed, the object to be processed is not limited thereto and an LCD substrate, a glass substrate and the like, can be employed.

What is claimed is:

1. A processing method for processing an object to be processed by using a processing apparatus including a processing chamber; a shower head structure, installed at a ceiling portion of the processing chamber, having a plurality of gas jetting holes formed on a gas jetting surface thereof to inject a processing gas into the processing chamber, the gas jetting surface facing toward an inside of the processing chamber; and a mounting table installed in the processing chamber to face toward the shower head structure, the method comprising the steps of:

loading the object to be processed on the mounting table; and introducing the processing gas through the gas jetting holes into the processing chamber, wherein while processing the object, a head distance between the gas jetting surface and the mounting table and a gas jetting velocity from the gas jetting holes are restricted to be within an area in a plane coordinates system having the head distance as a horizontal axis and the gas jetting velocity as a vertical axis, the area being surrounded by a quadrilateral shape formed by straight lines connecting four points including a point where the gas jetting velocity is 32 m/sec and the head distance is 15 mm; a point where the gas jetting velocity is 67 m/sec and the head distance is 15 mm; a point where the gas jetting velocity is 40 m/sec and the head distance is 77 mm; and a point where the gas jetting velocity is 113 m/sec and the head distance is 77 mm.

2. The method of claim 1, wherein the processing gas contains ozone for reforming a metal oxide film formed on a surface of the object to be processed.

3. The method of claim 2, wherein the metal oxide film is a tantalum oxide film.

4. The method of claim 1, wherein while processing the object, a pressure inside the processing chamber is maintained at a constant level.

5. The method of claim 1, wherein while processing the object, a temperature of the object to be processed is maintained at a constant level.

6. A processing method for processing an object, said method comprising:

loading the object onto a mounting table provided within a processing chamber having a plurality of gas jetting holes formed on a gas jetting surface facing towards the mounting table; and injecting a processing gas into the processing chamber through the plurality of gas jetting holes while restricting a distance between the gas jetting surface and the mounting table and a velocity of the processing gas from the plurality of gas jetting holes to be within an area in a plane coordinates system having the distance as a first axis thereof and the velocity as a second axis that is perpendicular to the first axis, wherein the area has a quadrilateral shape formed by a first line connecting a first point where the velocity is 32 m/sec and the distance is 15 mm and a second point where the velocity is 67 m/sec and the distance is 15 mm, a second line connecting the first point to a third point where the velocity is 40 m/sec and the distance is 77 mm, a third line connecting the second point to a fourth point where the velocity is 113 m/sec and the distance is 77 mm, and a fourth line connecting the third point to the fourth point.

7. The method of claim 6, wherein the processing gas being injected into the processing chamber contains ozone for reforming a metal oxide film formed on a surface of the object.

8. The method of claim 7, wherein the metal oxide film is a tantalum oxide film.

9. The method of claim 6, further comprising maintaining a pressure within the processing chamber at a constant level while the processing gas is being injected into the processing chamber.

10. The method of claim 6, further comprising maintaining a temperature within the processing chamber at a constant level while the processing gas is being injected into the processing chamber.

11. The method of claim 6, wherein the processing chamber in which the object is loaded is configured such that the plurality of gas jetting holes are all provided within a circular area on the gas jetting surface, and such that the mounting table has a circular shape.

12. The method of claim 11, wherein the circular area has a diameter that is equal to or smaller than a diameter of the object.

13. The method of claim 11, wherein the circular area has a diameter that is 70% to 100% of a diameter of the object.

* * * * *